United States Patent [19]

McElheny et al.

[11] Patent Number: 4,801,912
[45] Date of Patent: Jan. 31, 1989

[54] SURFACE MOUNTABLE ELECTRONIC DEVICE

[75] Inventors: Donald C. McElheny, Delevan; Dale A. Ponivas, West Seneca; David A. Syracuse, Hamburg; Stephen H. Chandler, Springville; Robert H. Nareau, Elma, all of N.Y.

[73] Assignee: American Precision Industries Inc., Buffalo, N.Y.

[21] Appl. No.: 742,452

[22] Filed: Jun. 7, 1985

[51] Int. Cl.$^4$ .................... H01F 15/04; H01F 15/10
[52] U.S. Cl. .................... 336/84 M; 336/83; 336/96; 336/192; 338/272; 361/405
[58] Field of Search .............. 336/65, 84 M, 90, 96, 336/105, 192, 84 R, 84 C, 83; 361/403, 413, 404, 405, 306, 308, 310; 338/272, 274, 275, 271, 273, 332, 265, 266

[56] References Cited

U.S. PATENT DOCUMENTS

| | | | |
|---|---|---|---|
| 2,332,255 | 10/1943 | Podolsky | 338/272 X |
| 2,355,611 | 8/1944 | Veley | 336/192 X |
| 2,407,171 | 9/1946 | McFarren | 338/274 |
| 2,933,677 | 4/1960 | Lieber | 336/84 M X |
| 2,933,709 | 4/1960 | Wutz | 338/275 |
| 2,949,591 | 8/1960 | Craige | 336/83 |
| 3,012,273 | 12/1961 | Lewis | 18/4 |
| 3,101,466 | 8/1963 | Armstrong | 338/273 |
| 3,243,670 | 3/1966 | Dunster et al. | 317/234 |
| 3,493,909 | 2/1970 | Beverly | 336/178 |
| 3,722,084 | 9/1971 | Caddock | 29/610 |
| 3,778,532 | 12/1973 | Braden | 361/405 |
| 3,824,518 | 7/1974 | Slenker | 336/96 |
| 3,849,878 | 11/1974 | Rudd et al. | 29/610 |
| 3,864,798 | 2/1975 | Utner | 29/25.42 |
| 4,064,472 | 12/1977 | Gunewalden et al. | 336/96 X |
| 4,231,985 | 11/1980 | McElheny | 264/262 |
| 4,490,706 | 12/1984 | Satou et al. | 336/96 |
| 4,538,346 | 9/1985 | Street | 361/403 X |
| 4,571,662 | 2/1986 | Conquest et al. | 361/306 |
| 4,574,262 | 3/1986 | Hamazawa et al. | 336/192 |
| 4,581,479 | 4/1986 | Moore et al. | 361/308 |
| 4,614,995 | 9/1986 | Lavene | 361/308 |
| 4,617,609 | 10/1986 | Utner et al. | 361/310 |

FOREIGN PATENT DOCUMENTS

| | | | |
|---|---|---|---|
| 673638 | 11/1963 | Canada | 336/96 |
| 2246573 | 4/1974 | Fed. Rep. of Germany | 361/306 |
| 2561034 | 9/1985 | France | 361/306 |
| 70507 | 4/1983 | Japan | 336/192 |
| 68913 | 4/1983 | Japan | 336/192 |
| 413746 | 7/1934 | United Kingdom | 361/306 |

Primary Examiner—Thomas J. Kozma
Attorney, Agent, or Firm—Christel, Bean & Linihan

[57] ABSTRACT

A surface mountable electronic device and method of making same wherein a discrete electronic device is encapsulated in a body of electrical insulating material having opposite ends and mounting surface extending between the ends, and an electrode is provided on each end. Each electrode includes a portion on the end of the body in electrical contact with the corresponding lead of the discrete electronic device and a contact portion extending along the mounting surface for making electrical connection to a circuit portion defined on a surface to which the device is mountable. The discrete electronic device is manufactured, prior to encapsulation, by known techniques. Preferably the body is a rectangular solid with each of the four sides having electrode contact portions thereon to serve as one of four possible mounting surfaces each with substantial mechanical stability. When the discrete electronic device is an inductor, interruption of the magnetic field is minimized by spacing the ends of the inductor core from the ends of the encapsulating body, separating the electrode contact portions, having the area of the electrode end portion less than the area of the end of the encapsulating body, and having the cross-sectional area of the most narrow section of the electrode end portion no less than the cross sectional area of the magnetic wire of the inducator winding. In the case of a shielded inductor, phenolic core inductor or non-inductive device, electrodes or diode, solid metal electrode can be employed.

5 Claims, 3 Drawing Sheets

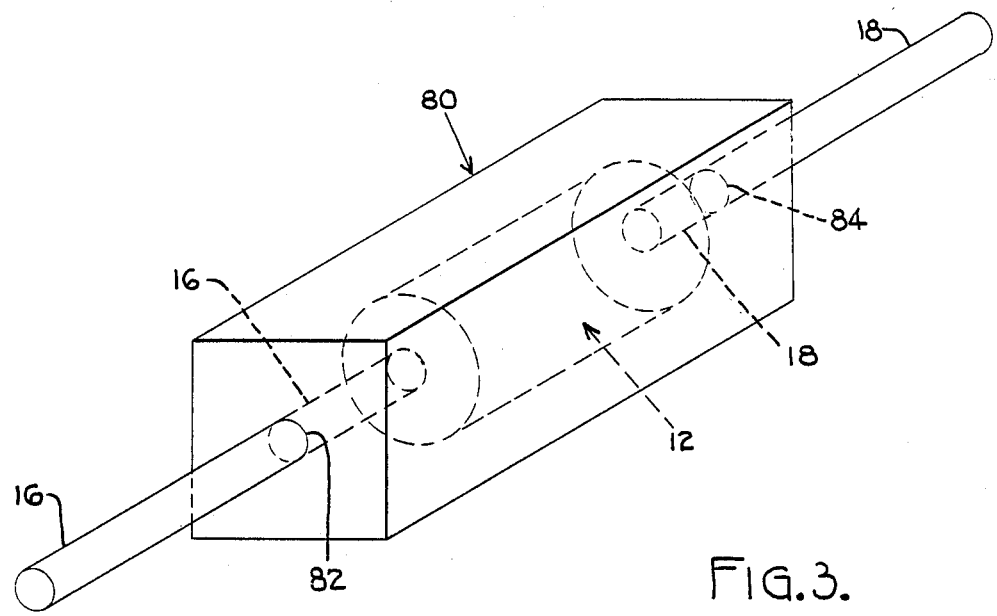
FIG. 3.
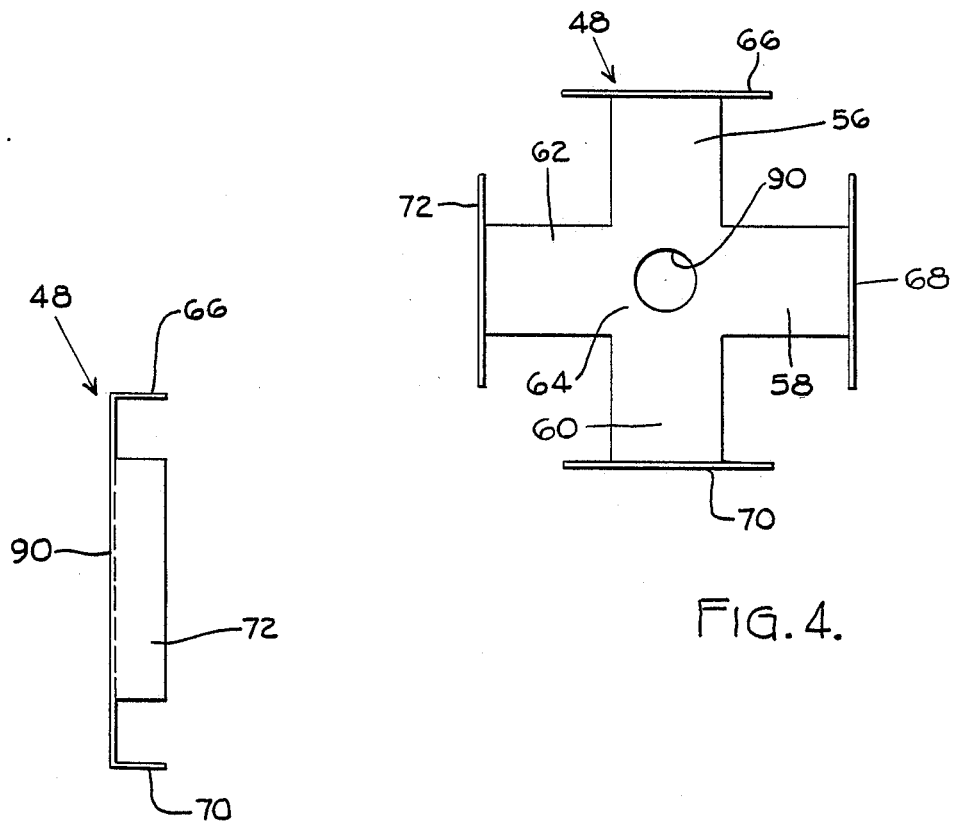
FIG. 4.
FIG. 5.

SURFACE MOUNTABLE ELECTRONIC DEVICE

BACKGROUND OF THE INVENTION

This invention relates to the art of electronic devices, and more particularly to a new and improved surface mountable electronic device and method of making the same.

One area of use of the present invention is in mounting electronic devices to circuit cards or boards, although the principles of the present invention can be variously applied. Elecrtronic circuit cards or boards have circuit paths provided on a surface thereof. It is necessary to connect the extending leads of an electronic device, for example an inductor or resistor, to the board and to the paths to provide both an electrical connection to the paths and an adequate mechanical connection to the board. Conventionally, this is accomplished by providing small apertures in the board through which the leads of the device extend and are soldered therein in a manner providing electrical and mechanical connections.

In recent times, surface mountable devices have become increasingly desired and requested. Briefly, such devices have electrodes rather than leads and are mounted directly on the circuit paths on the board and thereby avoid the need for apertures in the board. It would be highly desirable to provide a surface mountable electronic device in a manner utilizing the known and proven techniques for making leaded electronic devices.

SUMMARY OF THE INVENTION

It is, therefore, a primary object of this invention to provide a new and improved surface mountable electronic device and method of making the same.

It is a more particular object of this invention to provide such a device and method which utilizes known and proven techniques for making electronic devices having extending leads and then adapts the same to a surface mountable device having spaced electrodes.

It is a more particular object of this invention to provide such a device in the form of an inductor wherein interruption of the magnetic field is minimized or avoided.

It is a further object of this invention to provide such a device which is mountable in various orientations and has significant mechanical stability when mounted.

It is a further object of this invention to provide such a device and method which is relatively simple and is economical and reliable.

The present invention provides a surface mountable electronic device comprising is discrete electronic device encapsulated in a body of electrical insulating material having first and second ends, a mounting surface extending between the ends, and first and second electrode means on the first and second ends of the body, respectively. Each of the electrode means includes an end portion on the corresponding end of the body in electrical contact with the corresponding lead of the discrete electronic device and a contact portion extending along the mounting surface for making electrical connection to a circuit having a portion defined on a surface to which the device is mountable. The discrete electronic device is manufactured, prior to encapsulation, by known and proven techniques. Preferably the body is a rectangular solid with each of the four sides having electrode contact portions thereon to thus serve as one of four possible mounting surfaces each with substantial mechanical stability. When the discrete electronic device is an inductor, interruption of the magnetic field is minimized by spacing the ends of the inductor core from the ends of the encapsulating body, separating the electrode contact portions, having the area of the electrode end portion less than the area of the end of the encapulating body, and having the cross-sectional area of the most narrow section of the electrode end portion no less than the cross sectional area of the magnetic wire of the inductor winding. In the case of a shielded inductor, phenolic core inductor or non-inductive device such as a resistor, capacitor or diode, solid metal electrode can be employed.

The method of the present invention includes providing a discrete electronic device comprising a body and a pair of spaced apart leads extending out from the body in generally different directions, encapsulating the device body and the leads in electrical insulating material in a manner shaping the material to provide a body having first and second spaced-apart ends and a mounting surface extending between the ends and to expose the ends of the leads, and applying first and second electrode means on the first and second ends of the body, respectively, and on adjacent regions of the mounting surface to be in electrical contact with the corresponding one of the leads and to provide contact portions extending along the mounting surface adjacent the end for making electrical connection to a circuit having a portion defined on a surface to which the device is mountable.

The foregoing and additional advantages and characterizing features of the present invention will become clearly apparent upon a reading of the ensuing detailed description together with the included drawing wherein:

BRIEF DESCRIPTION OF THE DRAWING FIGURES

FIG. 3 is a perspective view of a mold and illustrating a portion of the method of the present invention;

FIG. 4 is an end elevational view of one of the electrodes in the device of FIG. 1 and in a direction toward the end of the electrode facing the device body;

FIG. 5 is a side elevational view of the electrode of FIG. 4;

DETAILED DESCRIPTION OF THE ILLUSTRATED EMBODIMENTS

Figure 1:
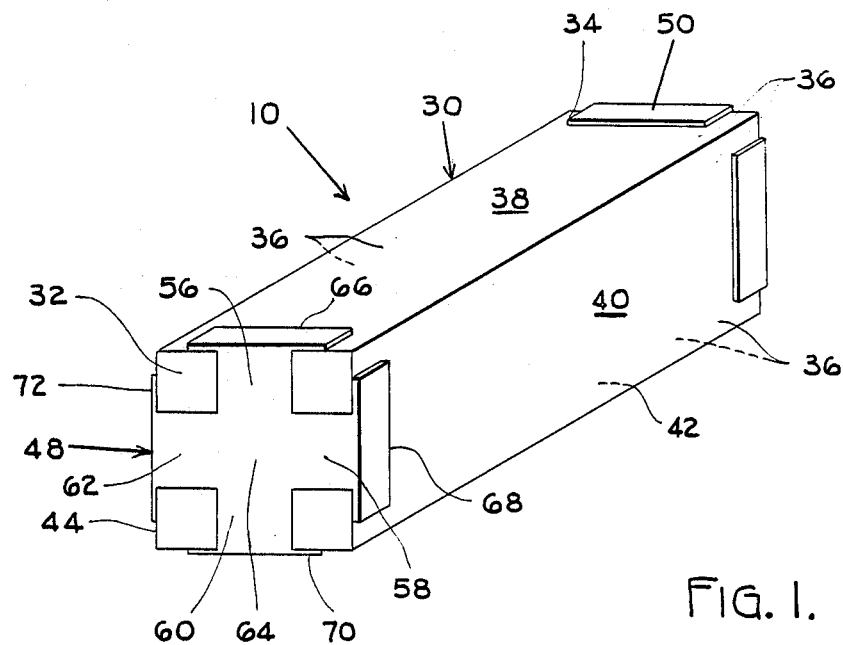
FIG. 1 is a perspective view of a surface mountable electronic device accoridng to the present invention.
Figure 2:
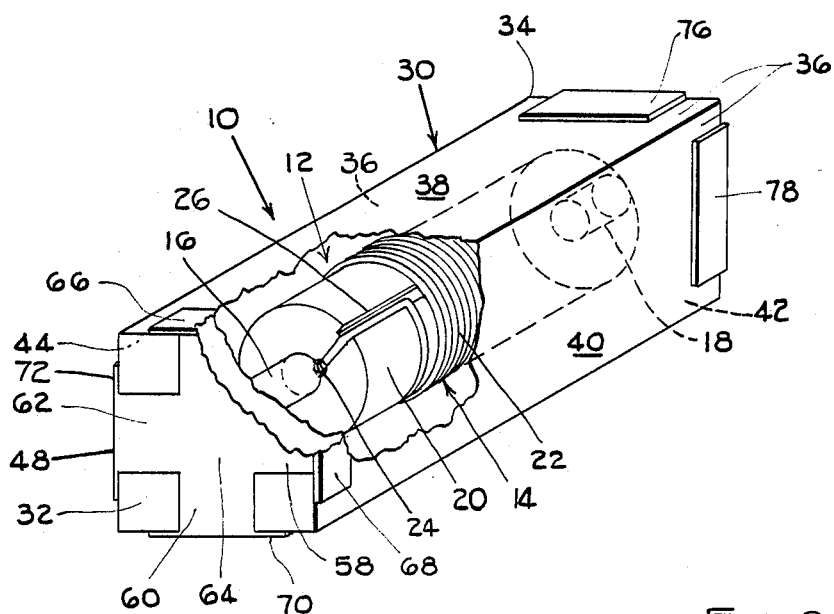
FIG. 2 is a view similar to FIG. 1 with parts broken away.

Referring now to FIGS. 1 and 2 there is shown a surface mountable electronic device generally designated 10 according to one embodiment of the present invention. Device 10 includes a discrete electronic device 12 comprising a body 14 and a pair of spaced-apart leads 16,18 extending out from body 14 in generally different directions. In the device shown, the discrete electronic device is an inductor wherein body 14 includes a core 20 and a winding 22 extending along core 20 and secured at each end to corresponding ones of the leads 16, 18. The leads 16, 18 are brazed or soldered, such as at 24, to terminations of winding 22. Core 20 can be provided with a longitudinally extending slot 26 to facilitate retention of winding 22 on core 20. Advantageously, the device 12 in the from of an inductor is manufactured by known, conventional and proven techniques. In other words, the surface mountable device 10 of the present invention is made in a manner which does not require any modification in the manufacture of the discrete electronic device thereof which is rendered surface mountable. In the device shown, inductor 12 has an axis coincident with the longitudinal axis of core 20 which is generally cylindrical in shape and leads 16,18 extend in opposite directions along the axis.

The surface mountable device 10 of the present invention further comprises a body generally designated 30 of electrical insulating material encapsulating body 14 and the leads 16, 18 of the discrete electronic device. Insulating body 30 has first and second ends 32 and 34, respectively, and a mounting surface 36 extending between the ends. In the device shown, body 30 is elongated having a longitudinal axis and ends 32,34 are disposed in spaced-apart planes each substantially perpendicular to the body longitudinal axis. Body 30 is in the form of a rectangular solid wherein ends 32,34 are planar and including four planar, orthogonally disposed sides 38,40,42 and 44 extending between ends 32,34. The sides 38,40,42 and 44 comprise sections of mounting surface 36 in a manner which will be described. In the device shown, the electronic device 12 is located in body 30 such that the axis of device 12 is substantially coincident with the longitudinal axis of body 30, and leads 16 and 18 extend along that axis and are disposed substantially perpendicular to th ends 32 and 34, respectively. Leads 16 and 18 terminate adajcent the ends 32 and 34, respectively and ends 32,34 are spaced from the corresponding ends of body 14 of device 12 in a manner which will be described. By way of example, in an illustrative device, body 30 is molded of epoxy.

The surface mountable device 10 of the present invention further comprises first and second electrode means 48 and 50, respectively, on the first and second ends 32 and 34, respectively, of body 30. Each of the electrode means 48,50 includes an end portion on the corresponding end 32,34 of body 30 and in electrical contact with the corresponding one of leads 16, 18. Each of the electrode means 48,50 further includes a contact portion extending along the mounting surface 36 for making electrical connection to a circuit having a portion defined on a surface to which device 10 is mountable. The first and second electrode means 48 and 50 are identical, and for convenience in description only electrode 48 will be described in detail, it being understood that the description applies also to electrode 50. In the device 10 of this embodiment of the present invention, the end portion of each electrode means 48,50 has a surface area less than the surface area of the corresponding body end 32,34 on which the electrode end portion is located. The electrode end portion is elongated in shape, extending from the termination of the corresponding one of the leads 16,18 along the end of the body to the junction of the end 32 and the mounting surface 36 at which junction the electrode end portions meets the electrode contact portion. In addition, the elongated end portion of electrode means 48 has a width and length dimensions such that the cross-sectional area thereof is substantially no less than the cross-sectional area of the wire of winding 22 for a reason which will be described.

In the device shown, the end portion of electrode means 48 includes a plurality of sections, in the present illustration four sections 56, 58, 60 and 62 each being elongated in shape and extending from a central or common region 64 coincident with the end of lead 16. The sections 56,58,60 and 62 are in angularly spaced relation on body end 32, in particular spaced at about right angles to each other, and each extends to the junction of end 32 and mounting surface 36 where it meets a corresponding contact section as will be described. The sections 56, 58, 60 and 62 are rectangular in shape, of equal length and of equal lateral dimension or width. Accordingly, each section 56, 58, 60 and 62 has substantially parallel side edges and the side edges of angularly adjacent sections meet at right angles. The cross sectional area of each section 56,58, 60 and 62 is substantially no less than the cross sectional area of the wire of winding 22. Thus, there is one of the sections 56,58, 60 and 62 for each of the sides 38, 40, 42 and 44 respectively, of body 30 with the sections 56,58,60 and 62 being in orthogonal relation.

In the device shown, the contact portion of electrode means 48 includes a plurality of spaced-apart sections, in the present illustration four sections 66, 68, 70 and 72 extending from the corresponding electrode end portion sections 56, 58, 60 and 62, respectively and located on the sides 38, 40, 42 and 44, respectively, of body 30. Thus there is one contact portion section on each face of body 30, and each section is spaced from the neighboring section on an adjacent face of body 30. In the device shown, each of the contact sections 66, 68 70 and 72 is elongated rectangular in shape having a longitudinal axis disposed perpendicular to the longitudinal axis of body 30. Each section 66, 68, 70 and 72 has a length equal to or greater than the width of the corresponding end portion sections 56, 58, 60 and 62, respectively, but less than the width or lateral dimension of the corresponding sides 38, 40, 42 and 44, respectively, of body 30. In the illustrative device shown, the length of each section 66, 68, 70 and 72 is greater than the width of each section 56, 58, 60 and 62. The width of each section 66, 68, 70 and 72 is selected to provide adequate contact area. Furthermore, the contact sections 66, 68, 70 and 72 adjacant end 32 of body 30 are in alignment with the corresponding contact sections of electrode means 50 adjacant body end 34. Thus, contact section 66 is in alignment with contact section 76 of electrode means 50 which is also on side 38 and is adjacant end 34. Similarly, contact section 68 is in alignment with contact section 78 which is also on side 40 and adjacant end 34. As a result, any of the sides 38, 40, 42 and 44 can serve as mounting surface for device 10 since a pair of aligned contact portions is on each side.

In the inductor of FIGS. 1 and 2, core 20 can be of phenolic material, powdered iron or ferrite material. There are several important design considerations which must be taken into account because of problems which can arise if the magnetic field of the inductor is interrupted. The molded epoxy of body 30 is dimensioned in a manner such that spacing is provided between each end of core 20 and the corresponding ends 32 and 34 of body 30. This space provides an area for the magnetic lines of force of flux from winding 22 to travel through with little interference from the metal electrodes 48, 50 on the ends. In particular, the corresponding end of core 20 is located inwardly of the inner edge of the electrode contact section which extends along the mounting surface of body 30. The foregoing is to avoid a reduction in the Q of the inductor which otherwise could occur if the end of core 20 was too close to the corresponding metal electrode.

The area of metalization on the side of the component that is intended for surface mounting, i.e. the area of the electrode contact portions which are on the mounting surface 36, is selected to maximize the area for mounting while maintaining enough distance between adjacent areas or contact sections to avoid shorting. Shorting from side to side, i.e. between adjacent contact sections, would act like a shorted turn of the inductor and thereby reduce the Q.

The cross sectional area of the most narrow section of the end portion of each electrode means 48, 50 will not be less than the cross section area of the magnetic wire of winding 22. This is to prevent the occurrence of hot spots or similar phenomenon if the electrode end portion dimension was smaller than the lead-cross sectional dimension.

In view of the fact that the metal electrodes 48, 50 at the ends of body 30 tend to break up or interfere with the lines of magnetic flux emanating from winding 22, the amount of metalized surface on each end must be minimized as much as possible without sacrificing mechanical strength needed for assembly operations. Reducing the area of metal reduces incremental eddy current losses which, in turn, will tend to increase the Q of the coil. The foregoing is accomplished by the cruciform shape of each electrode 48, 50 on the corresponding ends of body 30. In addition, the amount of open end space, i.e. not covered by the metal electrode, is a variable which can be used to optimize performance of the device.

However, there are certain conditions that can exist in an inductor that will cause the amount of metal electrode surface to be less critical so that even a solid metal electrode can be used as will be described. Also, solid metal electrodes can be employed where the discreet device is of a different nature, for example a capacitor or resistor, as will be described.

By way of example, in an illustrative device, body 30 has a maximum length of 0.320 inch and ends 32,34 each are square with maximum sides of 0.130 inch. Each of the contact sections on both electrods 48,50 has a minimum length of 0.075 inch and minimum width of 0.020 inch.

The inductor of FIGS. 1 and 2 is made according to the method of the present invention in the following manner. First, the discreet electronic device 10, in the form of an inductor, is provided. It is a particular advantage of the method of the present invention that device 10 can be made according to known, conventional and proven manufacturing techniques. Briefly, the core 20 is formed from selected material, magnet wire is wound thereon to provide winding 22 and leads 16, 18 are soldered as at 24 to terminations of winding 22 and extend out from opposite ends of the device.

The next step in the method of the present invention is encapsulating the device body and leads, in this case core 20, winding 22 and leads 16,18, in electrical insulating material in a manner shaping the material to provide a body having first and second spaced apart ends and a mounting surface extending between the ends and to expose the ends of the leads. The requirements for the material are that it provides adequate electrical insulation and mechanical stability in the resulting surface mountable device. The inductor 14 and leads 16, 18 are placed in a mold generally designated 80 in FIG. 3, the interior of which is shaped to define the desired shape of body 30, in the present illustration elongated rectangular. Mold 80 is provided with openings 82, 84 at opposite ends through which end portions of leads 16, 18 extend. The body of inductor 14 comprising core 20 and winding 22 is positioned in mold 20 with the longitudinal axis of the inductor body substantially coincident with the longitudinal axis of mold 80, with the body of inductor substantially equi-distant from the four sides of mold 80, and with the ends of the inductor body spaced substantially equal distances to the corresponding ends of mold 80. The electrical insulating material, for example a high-grade, thermosetting epoxy material, is introduced to mold 80 filling the interior and encapsulating the core 20, winding 22 in portions of leads 16, 18 contained within mold 80. The epoxy material is allowed to cure or set, with application of heat if necessary. Then, the resulting body is removed from mold 80.

The next step in the method of the present invention is applying the first and second electrode means 48 and 50 on the first and second ends 32 and 34, respectively, of body 30 and on adjacent regions of the mounting surface 36. In making the inductor illustrated in FIGS. 1 and 2, the electrode means 48, 50 are preformed from a metal sheet to include the central region 64, end sections 56, 58, 60 and 62 and contact sections 66, 68, 70 and 72. Each electrode means 48, 50 then is placed with the end sections in contact with the respective body ends and the central section in contact with the corresponding exposed end of the leads and the contact sections are placed on the mounting surface. By way of further illustration, the foregoing can be accomplished by stamping each electrode 48, 50 from copper, placing the electrode against the end of body 30 with the lead protruding through a central hole in the electrode. The lead then is swaged or flattened against the electrode to hold it in place. The exposed copper area of each electrode then would be plated, for example with tin or tin-lead alloy. Alternatively, a plurality of electrodes are chemically milled on a metal frame piece, the flat electrode still in the frame is placed against the end of body 30 with a short portion of the corresponding lead extending through a center hole in the milled electrode shape. A suitable tool then cuts electrode off the frame, bends the contact sections over against the mounting surface portions, and swages the lead against the electrode to secure it. The exposed copper sections of the electrode are plated, for example with tin or tin-lead alloy.

FIGS. 4 and 5 show in further detail one of the electrode means, for example electrode 48, preformed from a metal sheet according to the foregoing techniques. Only the one electrode means 48 is shown, it being understood that the other electrode means 50 is identical. An aperture 90 is provided in central region 64. The side edges of each elongated, rectangular end section 56, 58, 60 and 62 are substantially mutually parallel, and adjacent side edges meet at substantially right angles. The end sections 56, 58, 60 and 62 and central region 64 are disposed in the same plane. The elongated, rectangular contact sections 66, 68, 70 and 72 are disposed at substantially right angles to the corresponding end sections 56, 58, 60 and 62 respectively. On each contact section 66, 68, 70 and 72 the side edges are mutually parallel, the end edges are mutually parallel, and adjacent side and end edges meet at substantially right angles. A preferred metal for each electrode means 48, 50 is ½ hard beryllium copper. A solder coating can be applied to the entire surface area of each electrode, the coating consisting by weight of 60% tin minimum and 40% lead maximum. Other suitable materials can be used for the electrodes, for example phospher bronze.

By way of example, in an illustrative device, the end portion has a thickness of about 0.005 inch, opening 90 has a diameter of about 0.025 inch, the width of each section 56, 58, 60 and 62 is about 0.040 inch and each contact section 66, 68, 70 and 72 has a length of about 0.080 inch, a width of about 0.020 inch and a thickness of about 0.005 inch.

In the foregoing techniques, the electrode means 48, 50 are preformed from a metal sheet and stamping or chemical milling methods are involved. As further alternatives, the electrode means could be provided by metallization application techniques including metallic spray or application of a solderable conductive epoxy.

In use, the device 10 as shown in FIG. 1 simply is placed on a flat printed circuit board with one of the mounting surface portions, for example side 40 on the board and the included contact sections, for example sections 68 and 78 in contact with appropriate sections of the circuit path defined on the board. The device is soldered or otherwise mounted in place at the region of contact between the contact sections 68 and 78 and the board circuit paths. One advantage of the configuration of FIG. 1 is that any of the four mounting surfaces 38, 40, 42 or 44 can be placed against the board thereby avoiding orientation problems in mounting. Furthermore, the relatively large flat surface area of each mounting surface portion 38, 40, 42 and 44 enhances the mechanical stability of the device when mounted. Another advantage of the configuration of FIG. 1 is that the remaining three mounting surfaces and included contact sections are readily accessible for test purposes while the device is mounted. A further advantage is that during manufacture there is some flexiblity in the selected thickness of the electrode contact sections, because if greater thickness is desired by the user of the surface mountable device, that can be accomplished by build-up of solder on the contact sections when the device is mounted.

An advantage of a surface mounted electronic device is that it frees up the opposite side of the printed circuit board for containing additional components. In other words, with a surface mounted device, there is no need to extend device leads through openings in the board for mechanical stability as is done conventionally with leaded devices. The present invention provides a surface mounted electronic device with the foregoing advantages and in a manner which advantageously utilizes known, existing and proven techniques of making the actual discrete device, i.e. the inductor, resistor or capacitor, which then is adapted for surface mounting according to the present invention.

Figure 6:
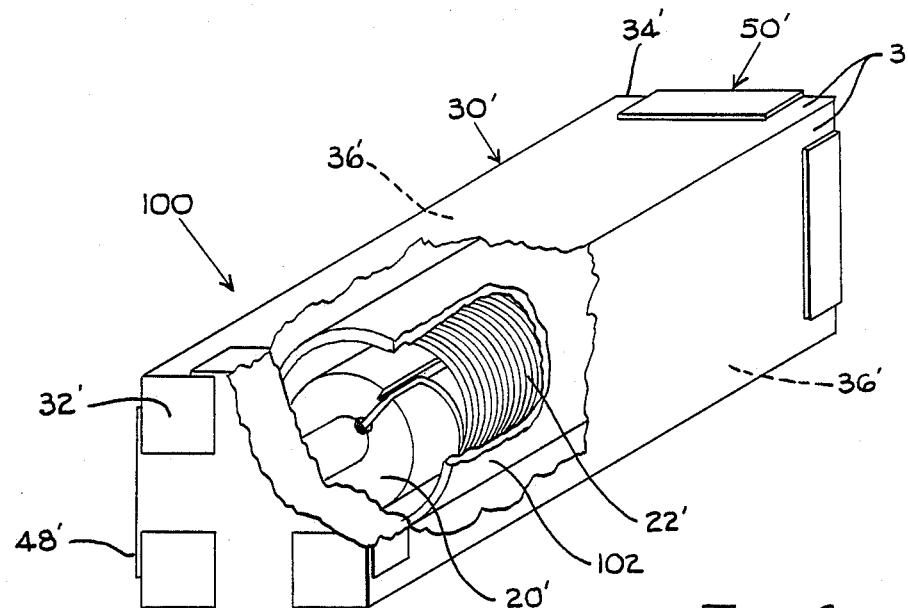
FIG. 6 is a perspective view with parts removed of a surface mountable electronic device according to another embodiment of the present invention.

FIG. 6 shows a surface mountable electronic device 100 according to another embodiment of the present invention. Device 100 is an inductor, and for convenience in illustration and description, components in FIG. 6 which are similar to those of the inductor of FIGS. 1 and 2 are identified by the same reference numeral with a prime designation. As in the inductor in FIGS. 1 and 2, core 20' is of powdered iron, phenolic or ferrite material and body 30' is of epoxy. Electrodes 48' and 50' are formed in a manner identical to that of electrodes 48 and 50 in the inductor of FIGS. 1 and 2. The inductor of FIG. 6 is of the shielded type and to this end includes shield means in the form of sleeve 102 surrounding core 20' and winding 24' for containing the magnetic lines of flux within shield 102. Sleeve 102 is of magnetic material and preferably is of the same material as core 20'. The inner and outer diameters of sleeve 102 are such that it is spaced radially outwardly of winding 22' and inwardly of the sections of mounting surface 36'. Generally, sleeve 102 is of the same axial length as core 20'. The wall thickness of sleeve 102 is selected to be thin enough to allow room between winding 22' and the confines of body 30' yet thick enough to withstand encapsulation in the material of body 30'.

The provision of shield means 102 to contain the lines of magnetic force or flux therein provides a condition in device 100 which causes the amount of metallized surface on ends 32', 34' to be less critical. While device 100 is shown in FIG. 6 with electrodes 48', 50' identical to electrodes 48, 50 of FIGS. 1 and 2, the provision of shield 102 enables solid metallized ends to be employed as the electrodes in a manner which will be described.

By way of example, in an illustrative device, body 30' has a maximum length of 0.500 inch, each end 32', 34' is substantially squre with maximum dimension of 0.197 inch by 0.200 inch, and the electrode contact sections each have a minimum width of 0.025 inch and a miminum length of 0.125 inch. The electrodes 48',50' are of ½ hard beryllium-copper coated with suitable tin-lead alloy such as 60/40 solder which meets the solderability requirements of M1L-STD 202F, METHOD 208C. Sleeve 102 is of powdered iron or ferrite material.

Figure 7:
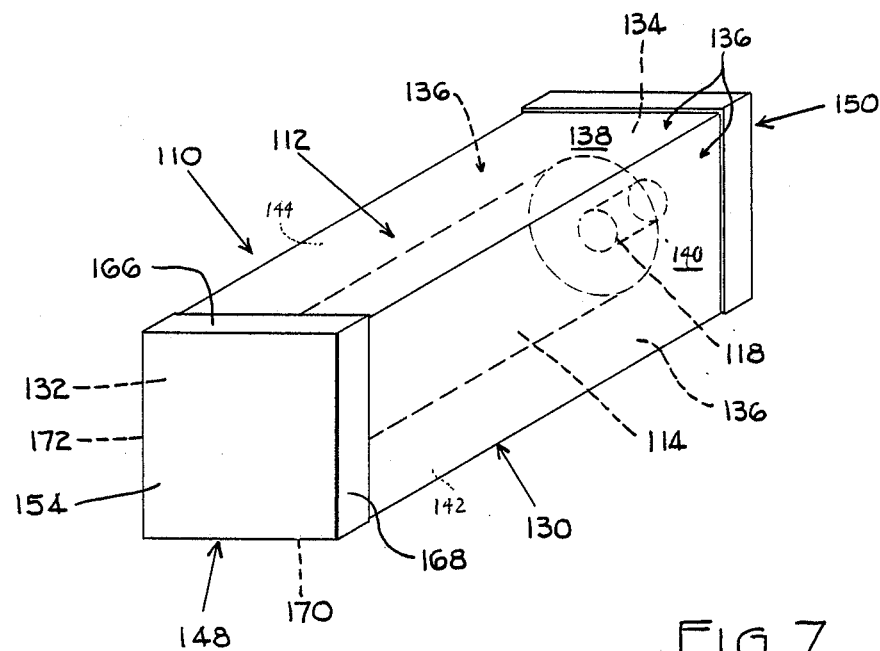
FIG. 7 is a perspective view of a surface mountable electronic device according to another embodiment of the present invention.

FIG. 7 shows a surface mountable electronic device 110 according to another embodiment of the present invention. Device 110 includes a discrete electronic device 112 comprising a body 114 and a pair of spaced-apart leads 116, 118 extending out from body 114 in generally different directions. In the device of this embodiment, the discrete electronic device is either non-inductive, for example a resistor, capacitor diode or the device is a shielded inductor as in FIG. 6 or a non-shielded inductor as in FIG. 2 having a core of phenolic material. As in the previous embodiments, advantageously the device 112 is manufactured by known conventional and proven techniques. Device 110 further comprises a body generally designated 130 of electrical insulating material encapsulating body 114 and leads 116, 118 of the discrete electronic device. Insulating body 130 has first and second opposite ends 132, 134 and a mounting surface 136 extending between the ends. As in the device of the previous embodiment, body 130 is in the form of a rectangular solid where ends 132, 134 are planar and including four planar orthogonally disposed sides 138, 140, 142 and 144 extending between ends 132, 134. The axis of device 112 is substantially coincident with the longitudinal axis of body 130, leads 116, 118 extend along that axis and are disposed substantially perpendicular to ends 132, 134 and terminate adjacent ends 132, 134, and the ends 132, 134 are spaced from the corresponding end of body 114. Body 130 is molded of epoxy material in a manner similar to that of the previous embodiments.

The surface mountable device 110 further comprises first and second electrode means 148 and 150, respectively, on the first and second ends 132 and 134 of body 30. In this embodiment of the present invention the electrode means 148, 150 are solid metal components covering the entire surface area of the corresponding ends 132, 134 of body 130 and extending on to mounting surface 136. The first and second electrode means 148, 150 are identical, and for convenience in description and illustration only one electrode 148 will be described in detail, it being understood that the description applies also to electrode 150. In particular, electrode means 148 includes an end portion 154 which extends across the entire surface of body end 132. In other words, the area of end portion 154 is substantially equal of the area of body end 134. End portion 154 is provided with a central aperature to receive the end of lead 116 for connection in a manner similar to that of the previous embodiments. Electrode means 148 also includes a contact portion extending along the mounting surface 136 for making electrical connection to a circuit having a portion defined on a surface to which device 110 is mountable. The contact portion is continuous including a plurality of sections 166, 168, 170 and 172 extending from end portion 154 onto sides 138, 140, 142 and 144 of body 130. Thus, there is no space or gap between adjacent sections 166, 168, 170 and 172. The electrode means 148, 150 of this embodiment of the present invention thus provide a solid or continuous metallization of the ends of body 130. The sections 166, 168, 170 and 172 are disposed at substantially right angles to the plane of end portion 154. Each electrode means 148, 150 can be preformed in the shape of a cap and slipped onto the corresponding end of body 130, or it cn be flat with cut-out sections 166, 168, 170 and 172 which are bent or otherwise formed onto the sections of mounting surface 136 after end portion 154 is placed against the body end 132. Each electrode means 148, 150 can be formed from Type C copper per M1L-STD-1276 with electro-tin plating on all sides or any othermaterial suitable for plating.

By way of example, in an illustrative device, body 130 has a maximum length of 0.320 inch, and each end is square with each electrode 148, 150 having an end portion with maximum dimensions of 0.130 inch by 0.130 inch and having contact sections each of a minimum width of 0.020 inch.

While the surface mountable device of the present invention has been illustrated in solid rectangular form, it can have other shapes. For example, the mounting surface could have more than four sides, or it could have three sides thereby providing a body of triangular cross-section. Also, the device could be in the form of a cylindrical solid in applications where stability provided by a flat mounting surface portion is not of importance.

It is therefore apparent that the present invention accomplishes its intended objects. While embodiments of the present invention have been described in detail, that is for the purpose of illustration, not limitation.

We claim:
1. A surface mountable electronic device comprising:
 (a) a discrete electronic device comprising a body having opposite ends and a pair of spaced apart leads extending out from said ends of said body in generally opposite directions and substantially along a common axis, said discrete device comprising an inductor including a core and a winding on said core and electrically connected to said leads;
 (b) an elongated rectangular solid body of electrical insulating material encapsulating said discrete device body and said leads, said body of insulating material having first and second ends facing and spaced from said ends of said discrete device body and parallel, planar mounting surfaces extending between said first and second ends, said leads terminating adjacent said first and second ends;
 (c) first and second electrode means on said first and second ends of said body of insulating material, respectively, each of said electrode means including an end portion on the corresponding end of said body of insulating material and in electrical contact with the corresponding one of said leads, each of said electrode means further including a pair of planar contact portions each one extending along a corresponding one of said mounting surfaces for making electrical connection to a circuit having a portion defined on a surface to which said electronic device is mountable in a mechanically stable manner;
 (d) said end portion of said electrode means having a surface area less than the surface area of the end of said body of insulating material on which said electrode end portion is located, said electrode end portion being elongated in shape having a length extending between said mounting surfaces and having a width, said electrode end portion extending from the termination of the corresponding one of said leads along said end of said body of insulating material to the junction of said end and said mounting surface of said body of insulating material, and said end portion having a common area substantially no less than the cross-sectional area of the wire of said inductor winding so that the occurrence of hot spots is prevented in a manner maximizing Q of said inductor and minimizing any reduction in the inductance thereof; and
 (e) said planar contact portion of said electrode means being elongated rectangular in shape having a length greater than the width thereof, said length of said contact portion being greater than said width of said electrode end portion.

2. A device according to claim 1, wherein each of said end portions of said first and second electrode means includes a plurality of sections, each section being elongated in shape extending from the termination of the corresponding one of said leads along said end of said body of insulating material to the junction of said end and a corresponding one of the faces of said body of insulating material, there being one of said sections for each face of said body of insulating material and said sections being in orthogonal spaced relation on said end of said body of insulating material.

3. A device according to claim 2, wherein each of said contact portions of said first and second electrode means includes a plurality of spaced-apart sections extending from corresponding ones of said electrode end portion sections, there being one contact portion section on each face of said body of insulating material and spaced from the neighboring section on an adjacent face, the contact sections adjacent one of said body of insulating material being in alignment with the contact sections adjacent the other end of said body of insulating material whereby any face of said body of said insulating material can serve as a mounting surface for said device.

4. A device according to claim 1, wherein said device further includes shield means surrounding a major portion of said inductor core and winding for containing magnetic flux from said inductor therein.

5. A device according to claim 1, wherein said body of insulating material has a longitudinal axis and said first and second ends of said body are disposed in planes substantially perpendicular to said longitudinal axis, said leads extending in a direction generally parallel to said longitudinal axis.

* * * * *